(12) United States Patent
Belkhayat et al.

(10) Patent No.: US 7,746,084 B2
(45) Date of Patent: Jun. 29, 2010

(54) IMPEDANCE MEASUREMENT USING LINE-TO-LINE CURRENT INJECTION

(75) Inventors: Mohamed Belkhayat, Alexandria, VA (US); Jing Huang, Rolla, MO (US); Keith Corzine, Rolla, MO (US)

(73) Assignees: Newport News Shipbuilding and Dry Dock Company, Newport News, VA (US); The Curators of the University of Missouri, Columbia, MO (US)

( * ) Notice: Subject to any disclaimer, the term of this patent is extended or adjusted under 35 U.S.C. 154(b) by 403 days.

(21) Appl. No.: 11/867,965

(22) Filed: Oct. 5, 2007

(65) Prior Publication Data

US 2008/0084219 A1 Apr. 10, 2008

Related U.S. Application Data

(60) Provisional application No. 60/849,559, filed on Oct. 5, 2006.

(51) Int. Cl.
*G01R 27/28* (2006.01)

(52) U.S. Cl. ..................... 324/649; 324/107

(58) Field of Classification Search .................. 324/649
See application file for complete search history.

(56) References Cited

U.S. PATENT DOCUMENTS 6,615,147 B1 * 9/2003 Jonker et al. .................. 702/61
6,983,211 B2 * 1/2006 Macfarlene et al. ........... 702/61
7,309,974 B2 * 12/2007 Sarlioglu et al. .............. 322/47
7,355,367 B2 * 4/2008 Sarlioglu et al. .............. 322/47
7,478,003 B2 * 1/2009 Cowan et al. ............... 702/117

* cited by examiner

*Primary Examiner*—Thomas Valone
(74) *Attorney, Agent, or Firm*—Alston & Bird LLP (57) ABSTRACT

An unbalanced line-to-line current is injected at an injected frequency in a three-phase ac circuit. A first set of voltages and currents are obtained. A first set of transformed voltages and transformed currents are produced. The circuit is injected with a second unbalanced line-to-line current at a frequency linearly independent of the injected frequency. A second set of voltages and current are obtained. A second set of transformed voltages and transformed currents are produced The impedance of a source portion and a load portion of the circuit are calculated using the first and second set of transformed voltages, and the first and second set of transformed currents.

22 Claims, 9 Drawing Sheets

IMPEDANCE MEASUREMENT USING LINE-TO-LINE CURRENT INJECTION

CROSS-REFERENCE TO RELATED APPLICATIONS

This application claims the benefit of U.S. Provisional Application No. 60/849,559, filed Oct. 5, 2006, which is incorporated herein by reference in its entirety.

FEDERALLY SPONSORED RESEARCH OR DEVELOPMENT

This invention was made in part with Government support under United States Department of Defense Contract number N00024-02-C-4056. The United States Government has certain rights in the invention.

BACKGROUND OF THE INVENTION

The invention relates generally to the field of power systems, and more particularly to impedance measurement techniques for determining the stability of power systems.

Power systems are incorporating a greater degree of electronic circuits, power electronic converters and electronic switching sources and loads. Although these components improve the performance of a power system, they are prone to instability due to their high efficiency and constant power characteristics which may lead to a negative impedance nature. The instability of these components affects the stability of the overall power system. Power system stability can be determined from the source and load impedances of the system. Thus, impedance measurement techniques for determining power system stability are becoming increasingly important in many applications; particularly in naval ship and aerospace power systems.

Figure 1:
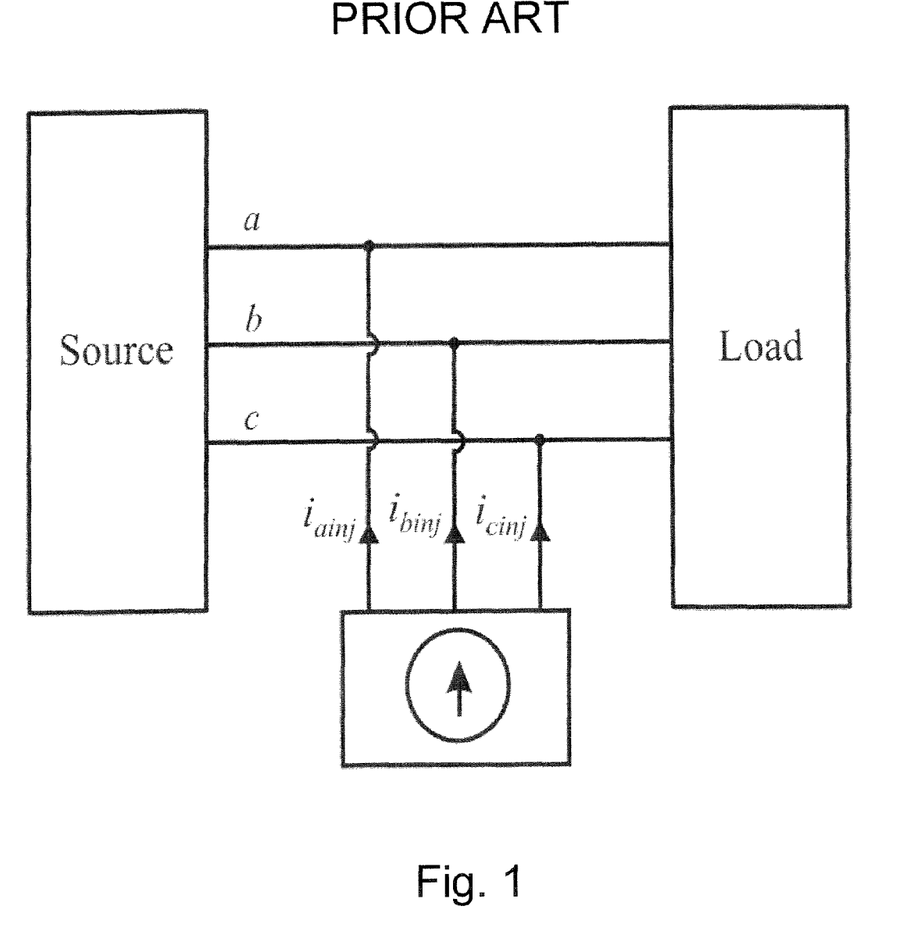
FIG. 1 is an illustration of a prior art current injection method for a three phase ac circuit.

Considerable research is being done on impedance measurement techniques that extract and measure the impedance of power system sources and loads to determine power system stability. Some effective impedance measurement techniques include current injection and voltage injection. For example, current injection techniques have been used to measure the impedance of a load and a source in a three phase alternating current (ac) circuit. However, prior current injection techniques of three phase ac circuits, as illustrated in FIG. 1, are not very efficient. Some of the problems caused by prior current injection techniques in three phase ac circuits are that the current must be injected at all phases of the circuit. Additionally, hardware implementation is difficult because of a complex hardware configuration. Further, the current being injected in the circuit is difficult to control.

These problems tend to limit the effectiveness of prior art current injection techniques of multi-phase ac circuits in applications where efficient and accurate determinations of power system stability is desirable.

SUMMARY OF THE INVENTION

The present invention provides impedance measurement systems and methods using line-to-line current injection. An aspect of the invention for measuring impedance of a three-phase ac circuit. The three-phase ac circuit has a source portion and a load portion that are integrally connected at each phase of the three-phase ac circuit. The three phase ac circuit is injected with a first unbalanced line-to-line shunt current at an injected current frequency. A first set of line voltages and a first set of phase currents of the three phase ac circuit are obtained. A first fundamental electrical frequency for the first set of line voltages and the first set of phase currents are determined. A first set of transformed voltages and a first set of transformed currents are produced by transforming the first set of line voltages and the first set of phase currents to a q-d synchronous reference frame using the first fundamental electrical frequency and applying a fast Fourier transform to the first set of line voltages and the first set of line currents at a frequency of interest.

The three phase ac circuit is injected with a second unbalanced line-to-line shunt current at a frequency linearly independent of the injected current frequency. A second set of line voltages and a second set of phase currents of the three phase ac circuit are obtained. A second fundamental electrical frequency for the second set of line voltages and the second set of phase currents is determine. A second set of transformed voltages and a second set of transformed currents are produced by transforming the second set of line voltages and the second set of phase currents to a q-d synchronous reference frame using the second fundamental electrical frequency and applying a fast Fourier transform to the second set of line voltages and the second set of line currents at a frequency of interest. An impedance and/or admittance of the source portion of the three phase ac circuit is calculated using the first set of transformed voltages, the first set of transformed currents, the second set of transformed voltages, and the second set of transformed currents. Further, an impedance and/or admittance of the load portion is calculated using the first set of transformed voltages, the first set of transformed currents, the second set of transformed voltages, and the second set of transformed currents.

It is to be understood that both the foregoing general description and the following detailed description are exemplary and explanatory only, and are not restrictive of the invention as claimed. The accompanying drawings constitute a part of the specification, illustrate certain embodiments of the invention and, together with the detailed description, serve to explain the principles of the invention.

BRIEF DESCRIPTION OF THE DRAWINGS

The invention can be more fully understood by reading the following detailed description together with the accompanying drawings, in which like reference indicators are used to designate like elements, and in which.

DETAILED DESCRIPTION OF THE INVENTION

The present systems and methods described herein provide methods for measuring impedance using line-to-line current injection. The methods provide an efficient and accurate way to measure impedance of a single phase ac circuit, a multi-phase ac circuit or a direct current circuit. These methods may be used to measure the impedance of a source and a load in a single phase ac circuit, a multi-phase ac circuit or a direct current circuit and thereby determine power system stability. As discussed in more detail below, these methods for measuring impedance may be performed using a current injection device and an interface device.

The systems and methods described herein provide for determining impedance in a multi-phase ac circuit by injecting the multi-phase ac circuit with a first unbalanced line-to-line shunt current at an injected current frequency. A first set of line voltages and a first set of phase currents of the multi-phase ac circuit are obtained. A first fundamental electrical frequency for the first set of line voltages and the first set of phase currents are determined. For analysis purposes, the first fundamental electrical frequency is determined by filtering a line voltage of the first set of line voltages and counting the period of the filtered signal. A first set of transformed voltages and a first set of transformed currents are produced by transforming the first set of line voltages and the first set of phase currents to a q-d synchronous reference frame using the first fundamental electrical frequency and applying a fast Fourier transform to the first set of line voltages and the first set of line currents at a frequency of interest.

The multi-phase ac circuit is injected with an additional unbalanced line-to-line shunt current at a frequency linearly independent of the injected current frequency. An additional set of line voltages and an additional set of phase currents of the multi-phase ac circuit are obtained. An additional fundamental electrical frequency for the additional set of line voltages and the additional set of phase currents is determine. For analysis purposes, the additional fundamental electrical frequency is determined by filtering a line voltage of the additional set of line voltages and counting the period of the filtered signal. An additional set of transformed voltages and an additional set of transformed currents are produced by transforming the additional set of line voltages and the additional set of phase currents to a q-d synchronous reference frame using the additional fundamental electrical frequency and applying a fast Fourier transform to the additional set of line voltages and the additional set of line currents at a frequency of interest. An impedance and/or admittance of the source portion of the multi-phase ac circuit is calculated using the first set of transformed voltages, the first set of transformed currents, the additional set of transformed voltages, and the additional set of transformed currents. Further, an impedance and/or admittance of the load portion is calculated using the first set of transformed voltages, the first set of transformed currents, the additional set of transformed voltages, and the additional set of transformed currents. The magnitude and phase of the first set of transformed voltages, the first set of transformed currents, the additional set of transformed voltages, and the additional set of transformed currents may use at least two linearly independent measurements to solve for the source and load impedances and/or admittances.

The systems and methods described herein provide for determining the impedance and/or admittance of a source and a load of a multi-phase ac circuit by injecting the circuit at least twice with unbalanced line-to-line shunt current at frequencies which are linearly independent to each other. The injection of the multi-phase ac circuit by the unbalanced line-to-line shunt current is continuous over a desired frequency range resulting in a continuous calculation of the impedance and/or admittance of the source portion and the load portion. The additional sets of voltages and the additional sets of currents are any number of additional sets of voltages and additional sets of currents and should not be limited numerically. A set may be a group including the voltage and current at each phase of the circuit and may be a group including voltages and currents in a reference frame. Further, the term multi-phase may refer to a circuit having at least one phase and may be used to refer to a single phase ac circuit.

As used herein, the term "unbalanced" means that at least one phase of a multi-phase circuit fails to be directly injected by a current injection device. Also, as used herein, the term "line to line" means the two phases of a multi-phase ac circuit are directly injected or connected by a current injection device. As used herein, the term "impedance" may refer to impedance or admittance of an electrical circuit. The impedance is the small signal impedance. It will be understood by those of ordinary skill in the art that the admittance of a circuit is the inverse of impedance (i.e. $Y=Z^{-1}$). The admittance is the small signal admittance. It will further be understood by those of ordinary skill in that art that a calculation of impedance or admittance will result in a convenient calculation of the other.

Figure 2:
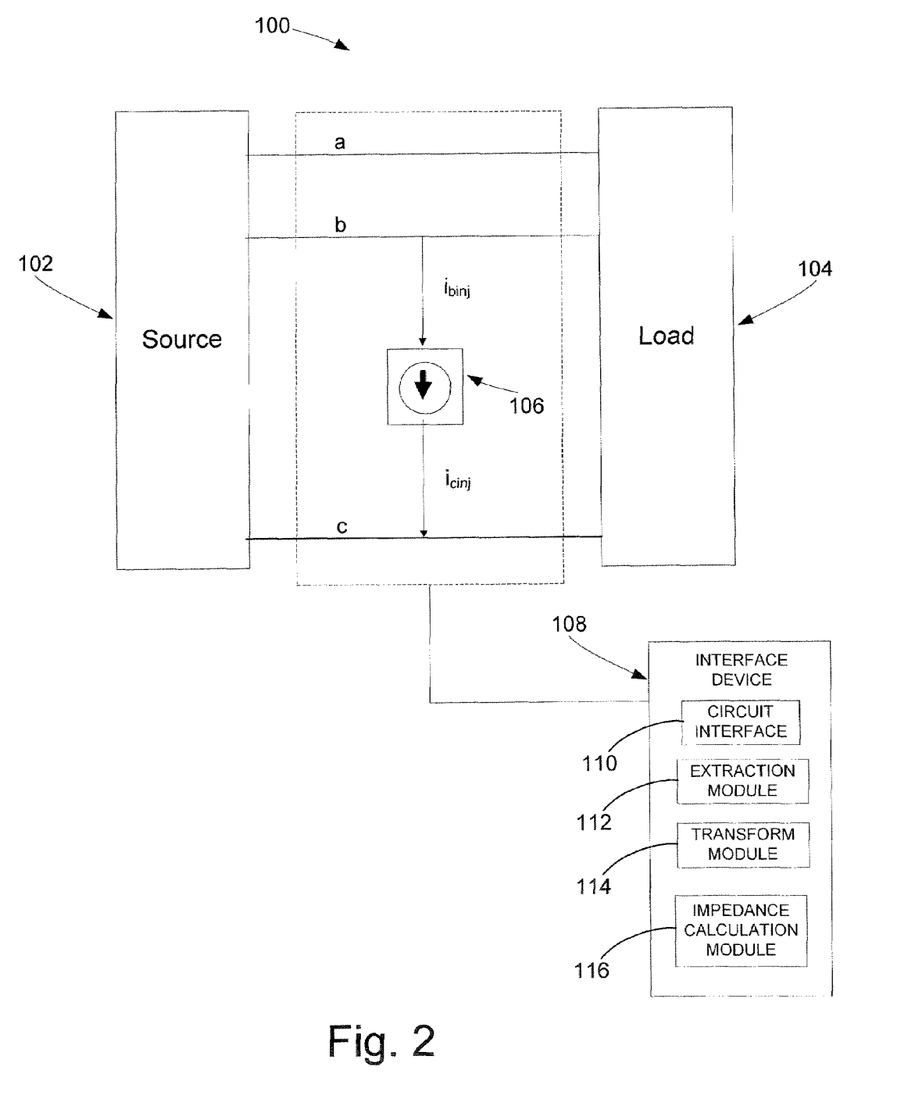
FIG. 2 is an illustration of a multi-phase ac circuit injected by a current injection device according to an embodiment of the invention.

FIG. 2 illustrates a current injection device injecting a multi-phase ac circuit in which impedance measurement using line-to-line current injection can be implemented. The multi-phase ac circuit 100 includes a source portion 102, and a load portion 104. A current injection device 106 injects an unbalanced line-to-line shunt at an injected current frequency in the multi-phase ac circuit 100. The current injection device 106 may inject an additional unbalanced line-to-line shunt current at a frequency linearly independent of the injected current frequency in the multi-phase ac circuit 100. An interface device 108 may inject the unbalanced line-to-line shunt current in the multi-phase ac circuit. The interface device 108 may interface with the multi-phase ac circuit 100 to calculate an impedance and/or admittance of the source portion 102 and the load portion 104 to determine power system stability.

The current injection device 106 of the systems and methods described herein may be an ideal amplifier, an H-bridge circuit, a chopper circuit or any other circuit. The current injection device 106 may include an insulated-gate bipolar transistor semiconductor switch, an Integrated Gate Commutated Thyristor switch, an field-effect transistor switch or any other type of switch. The unbalance line-to-line current may result in at least one phase of the multi-phase ac circuit 100 having a phase current equal to zero. Additionally, the injected current frequency can be any frequency of interest. The current injection device 106 may inject the multi-phase ac circuit 100 at an injected current frequency over a wide frequency range and at a predetermined frequency. The wide frequency range may range from 48 Hz to 4995 Hz. Further, the current injection device may be utilized in a multi phase ac, single phase ac and direct current circuit.

The interface device 108 of the systems and methods described herein may interface with the multi-phase ac circuit 100. In the embodiment illustrated in FIG. 2, the interface device 108 includes a circuit interface 110 in communication with the circuit 100 for measurement of circuit voltages and currents, an extraction module 112, a transform module 114 and an impedance calculation module 116. The interface device 108 may be or include an oscilloscope, a probe, a DAQ card, or any other analog to digital converter (ADC) that may interact with an electrical circuit and save data. The interface device 108 may also include mathematical process to obtain the impedance of the source and the load. The interface device 108 may obtain a first set of line voltages and a first set of phase currents of the multi-phase ac circuit 100 via the circuit interface 110. The extraction module 112 may be configured to determine a first fundamental electrical frequency for the first set of line voltages and the first set of phase currents. The transform module 114 may be configured to apply a fast Fourier transform to the first set of line voltages and the first set of phase currents at a frequency of interest and transform the first set of line voltages and the first set of phase currents to a q-d synchronous reference frame using the first fundamental electrical frequency to determine a first set of transformed voltages and a first set of transformed currents. It will be understood, however, that a mathematical process other than the fast Fourier transform may be used.

The interface device 108 may also obtain at least a second set of line voltages and at least a second set of phase currents of the multi-phase ac circuit 100 via the circuit interface 110. The extraction module 112 may be configured to determine at least a second fundamental electrical frequency for the at least a second set of line voltages and the at least a second set of phase currents. The transform module 114 may be configured to apply a fast Fourier transform to the at least a second set of line voltages and the at least a second set of phase currents at a frequency of interest and transform the at least a second set of line voltages and the at least a second set of phase currents to a q-d synchronous reference frame using the at least a second fundamental electrical frequency to determine at least a second set of transformed voltages and at least a second set of transformed currents. The interface device 108 may calculate the impedance and/or admittance of the source portion of the multi-phase ac circuit 100 using the first set of transformed voltages, the first set of transformed currents, the at least a second set of transformed voltages, and the at least a second set of transformed currents. The interface device 108 may calculate the impedance and/or admittance of the load portion of the multi-phase ac circuit 100 using the first set of transformed voltages, the first set of transformed currents, the at least a second set of transformed voltages, and the at least a second set of transformed currents. The magnitude and phase of the first set of transformed voltages, the first set of transformed currents, the at least a second set of transformed voltages, and the at least a second set of transformed currents may use at least two linearly independent measurements to solve for the source and load impedances and/or admittances.

The impedance calculation module 116 may use the first and at least a second set of transformed voltages and currents to calculate an impedance of the circuit 100 using the methodology discussed in more detail below.

It will be understood by those of ordinary skill in the art that the interface device may be any combination of hardware and data processing elements adapted to carry out the above-described functions and that the various functions may be distributed in any manner amongst the elements of the device.

The current injection device 106 may inject more than one unbalanced line-to-line shunt current in the multi-phase ac circuit 100 at a frequency linearly independent of the injected current frequency. A linear independent frequency may be obtained by injecting an unbalance current and/or by injecting a current at a frequency positively or negatively opposed to the initially injected current frequency. For example, if the injected current frequency is $f_s+f_e$ a frequency linearly independent of the injected current frequency may be $f_s-f_e$.

In the multi-phase ac circuit, the impedance of the source and load may be calculated using several sets of linearly independent equations $$\begin{bmatrix} v_q \\ v_d \end{bmatrix} = \begin{bmatrix} Z_{qq} & Z_{qd} \\ Z_{dq} & Z_{dd} \end{bmatrix} \begin{bmatrix} i_q \\ i_d \end{bmatrix}$$

to generate an impedance matrix of the source and the load. The impedance matrix may determine stability criteria for ac power systems.

Further, in the multi-phase ac circuit, the admittance of the source and load may be calculated using several sets of linearly independent equations $$\begin{bmatrix} i_q \\ i_d \end{bmatrix} = \begin{bmatrix} Y_{qq} & Y_{qd} \\ Y_{dq} & Y_{dd} \end{bmatrix} \begin{bmatrix} v_q \\ v_d \end{bmatrix}$$

to generate an admittance matrix of the source and the load.

The systems and methods described herein may also be performed in a single phase ac circuit or a direct current circuit. The steps and mathematical calculations may be performed on the single phase ac circuit and the direct current circuit to determine an appropriate impedance.

In an exemplary embodiment of current injection in a multi-phase ac circuit, as shown in FIG. 2. The multi-phase ac circuit may be a three phase ac circuit. The three phase circuit may have the similar features as the multi-phase circuit. The systems and methods described herein provide for determining impedance in a three-phase ac circuit by injecting the three phase ac circuit with a first unbalanced line-to-line shunt current at an injected current frequency. A first set of line voltages and a first set of phase currents of the three phase ac circuit are obtained. A first fundamental electrical frequency for the first set of line voltages and the first set of phase currents are determined. For analysis purposes, the first fundamental electrical frequency is determined by filtering a line voltage of the first set of line voltages and counting the period of the filtered signal. A first set of transformed voltages and a first set of transformed currents are produced by applying a fast Fourier transform to the first set of line voltages and the first set of phase currents at a frequency of interest and transforming the first set of line voltages and the first set of phase currents to a q-d synchronous reference frame using the first fundamental electrical frequency.

The three phase ac circuit is injected with a second unbalanced line-to-line shunt current at a frequency linearly independent of the injected current frequency. A second set of line voltages and a second set of phase currents of the three phase ac circuit are obtained. A second fundamental electrical frequency for the second set of line voltages and the second set of phase currents is determine. A second set of transformed voltages and a second set of transformed currents are produced by applying a fast Fourier transform to the second set of line voltages and the second set of phase currents at a frequency of interest and transforming the second set of line voltages and the second set of phase currents to a q-d synchronous reference frame using the second fundamental electrical frequency. An impedance and/or admittance of the source portion of the three phase ac circuit is calculated using the first set of transformed voltages, the first set of transformed currents, the second set of transformed voltages, and the second set of transformed currents. Further, an impedance and/or admittance of the load portion is calculated using the first set of transformed voltages, the first set of transformed currents, the second set of transformed voltages, and the second set of transformed currents.

As illustrated in FIG. 2, each phase of the three phase ac circuit is represented by a letter (i.e. a, b, and c). In this example, a line-to-line unbalanced shunt current is injected at phases b and c. Phase a receives no injection and has a current equal to zero. A mathematical representation of unbalanced line-to-line currents injected by the injection device at an injected current frequency and a frequency linearly independent of the injected current frequency is:

$i_{1ainj}=0$ $i_{1binj}=-I_m \cos(\omega_s t+\omega_e t)$ $i_{1cinj}=I_m \cos(\omega_s t+\omega_e t)$ $i_{2ainj}=0$ $i_{2binj}=-I_m \cos(\omega_s t-\omega_e t)$ $i_{2cinj}=I_m \cos(\omega_s t-\omega_e t)$ $i_1$ is the initially injected current at the injected current frequency, the subscript of 1 indicates that $i_1$ is the initially injected current at the injected current frequency and $i_2$ is the second injected current at a frequency linearly independent of the injected current frequency, the subscript of 2 indicates that $i_2$ is the second injected current at a frequency linearly independent of the injected current frequency. The injected current frequency is $f_s+f_e$ and the frequency linearly independent of the injected current frequency is $f_s-f_e$.

In the d-q synchronous reference frame, the injected currents include terms at the frequency, $\omega_s+2\omega_e$ and $\omega_s-2\omega_e$. The injected current in q-d frame can be expressed as $$i_{1qinj} = \frac{1}{\sqrt{3}}I_m \sin(\omega_s t) + \ldots$$

$$i_{1dinj} = \frac{1}{\sqrt{3}}I_m \cos(\omega_s t) + \ldots$$

$$i_{2qinj} = -\frac{1}{\sqrt{3}}I_m \sin(\omega_s t) + \ldots$$

$$i_{2dinj} = \frac{1}{\sqrt{3}}I_m \cos(\omega_s t) + \ldots$$

The magnitude of q- and d-axis terms of injected current are maintained while the injected signals are symmetrical about the d-axis. Further the two current vectors are linearly independent, and thus can be used to obtain the source and load impedance. Impedance measurements may be taken at the two linearly independent injected current frequencies. The impedance measurements may be taken with the injected switching frequency at $\omega_s+2\omega_e$ and a frequency linearly independent of the injected switching frequency at $\omega_s-2\omega_e$.

By transforming to d-q reference frame, the extracted d-q variables could be pure sinusoidal. However, two measurements need to be taken at different injection frequencies ($f_s \pm f_e$) for obtaining the impedance/admittance in the three-phase ac system.

Example unbalanced line-to-line shunt currents at two linearly independent frequencies are fairly easy to implement in hardware because one phase current is set to zero. Thus, any two sets of injected current frequencies that are linearly independent can be used to obtain a q-d impedance matrix and thereby determine a source and a load impedance.

The q-d impedance matrix may determine stability criteria for three phase ac power systems. It is possible to determine the matrix entries for a particular frequency by solving the following equation:

$$\begin{bmatrix} v_{q3} \\ v_{d3} \\ v_{q4} \\ v_{d4} \end{bmatrix} = \begin{bmatrix} Z_{qq} & Z_{qd} & 0 & 0 \\ Z_{dq} & Z_{dd} & 0 & 0 \\ 0 & 0 & Z_{qq} & Z_{qd} \\ 0 & 0 & Z_{dq} & Z_{dd} \end{bmatrix} \begin{bmatrix} i_{q3} \\ i_{d3} \\ i_{q4} \\ i_{d4} \end{bmatrix}$$

To generate the impedance matrix in a three phase ac system. Two sets of linear independent equations are calculated using this equation:

$$\begin{bmatrix} v_q \\ v_d \end{bmatrix} = \begin{bmatrix} Z_{qq} & Z_{qd} \\ Z_{dq} & Z_{dd} \end{bmatrix} \begin{bmatrix} i_q \\ i_d \end{bmatrix}.$$

To generate an admittance matrix in a three phase ac system. Two sets of linear independent equations are calculated using this equation $$\begin{bmatrix} i_q \\ i_d \end{bmatrix} = \begin{bmatrix} Y_{qq} & Y_{qd} \\ Y_{dq} & Y_{dd} \end{bmatrix} \begin{bmatrix} v_q \\ v_d \end{bmatrix}.$$

The impedance of the source portion in a three phase ac circuit may be calculated by solving:

$$\begin{bmatrix} v_{q3\_source} \\ v_{d3\_source} \\ v_{q4\_source} \\ v_{d4\_source} \end{bmatrix} = \begin{bmatrix} Z_{qq\_source} & Z_{qd\_source} & 0 & 0 \\ Z_{dq\_source} & Z_{dd\_source} & 0 & 0 \\ 0 & 0 & Z_{qq\_source} & Z_{qd\_source} \\ 0 & 0 & Z_{dq\_source} & Z_{dd\_source} \end{bmatrix} \begin{bmatrix} i_{q3\_source} \\ i_{d3\_source} \\ i_{q4\_source} \\ i_{d4\_source} \end{bmatrix}$$

The admittance of the source portion of the three phase ac circuit may be calculated by solving:

$$\begin{bmatrix} i_{q3\_source} \\ i_{d3\_source} \\ i_{q4\_source} \\ i_{d4\_source} \end{bmatrix} = \begin{bmatrix} Y_{qq\_source} & Y_{qd\_source} & 0 & 0 \\ Y_{dq\_source} & Y_{dd\_source} & 0 & 0 \\ 0 & 0 & Y_{qq\_source} & Y_{qd\_source} \\ 0 & 0 & Y_{dq\_source} & Y_{dd\_source} \end{bmatrix} \begin{bmatrix} v_{q3\_source} \\ v_{d3\_source} \\ v_{q4\_source} \\ v_{d4\_source} \end{bmatrix}$$

The impedance of the load portion of the three phase ac circuit may be calculated by solving:

$$\begin{bmatrix} v_{q3\_load} \\ v_{d3\_load} \\ v_{q4\_load} \\ v_{d4\_load} \end{bmatrix} = \begin{bmatrix} Z_{qq\_load} & Z_{qd\_load} & 0 & 0 \\ Z_{dq\_load} & Z_{dd\_load} & 0 & 0 \\ 0 & 0 & Z_{qq\_load} & Z_{qd\_load} \\ 0 & 0 & Z_{dq\_load} & Z_{dd\_load} \end{bmatrix} \begin{bmatrix} i_{q3\_load} \\ i_{d3\_load} \\ i_{q4\_load} \\ i_{d4\_load} \end{bmatrix}$$

The admittance of the load portion of the three phase ac circuit may be calculated by solving:

$$\begin{bmatrix} i_{q3\_load} \\ i_{d3\_load} \\ i_{q4\_load} \\ i_{d4\_load} \end{bmatrix} = \begin{bmatrix} Y_{qq\_load} & Y_{qd\_load} & 0 & 0 \\ Y_{dq\_load} & Y_{dd\_load} & 0 & 0 \\ 0 & 0 & Y_{qq\_load} & Y_{qd\_load} \\ 0 & 0 & Y_{dq\_load} & Y_{dd\_load} \end{bmatrix} \begin{bmatrix} v_{q3\_load} \\ v_{d3\_load} \\ v_{q4\_load} \\ v_{d4\_load} \end{bmatrix}$$

Figure 3:
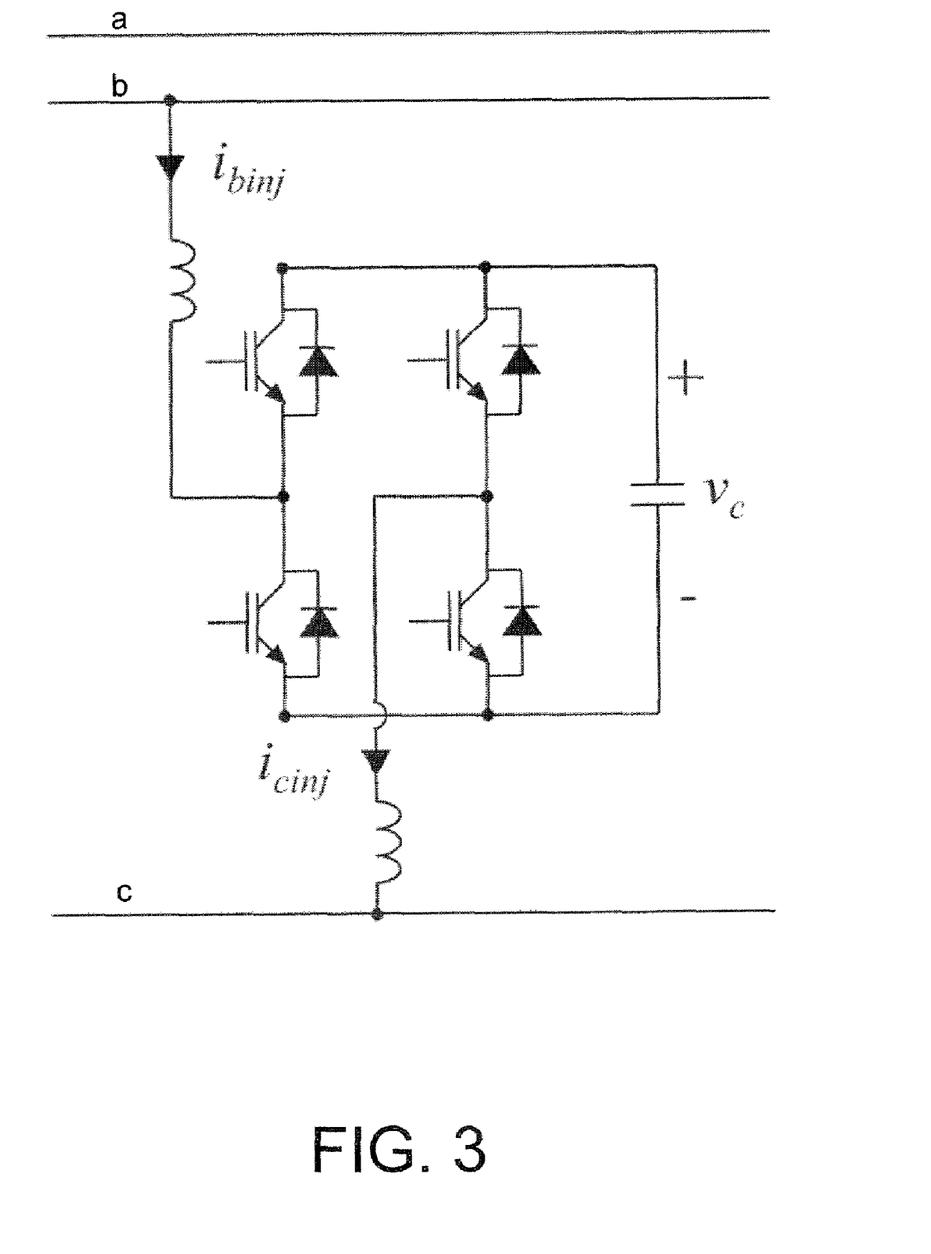
FIG. 3 is an illustration of a current injection device according to an embodiment of the invention.

In a direct current circuit, the impedance may be determined by calculating the following equation: $Z=\Delta v/\Delta i$, where $\Delta$ denotes the small deviation of the respective variable from the equilibrium point, Z is the impedance, v is the voltage, and i is the current. The admittance may be determined by the following equation. $Y=\Delta i/\Delta v$, where, $\Delta$ denotes the small deviation of the respective variable from the equilibrium point, Y is the admittance, v is the voltage, and i is the current According to some embodiments of the systems and methods described herein, the current injection device can be an H-Bridge circuit. FIG. 3 illustrates an H-bridge circuit functioning as a current injection device. Current-regulated pulse width modulation (PWM) techniques such as hysteresis modulation or delta modulation may be used to inject an accurate unbalanced line-to-line current. The advantage of the active H-bridge converter is accurate control of the injected currents. However, this control means that the switching frequency of the inverter must be several times the highest frequency component of the injected current. The H-Bridge circuit is recommended for low-voltage low-power systems where higher-frequency transistors can be found.

Figure 4:
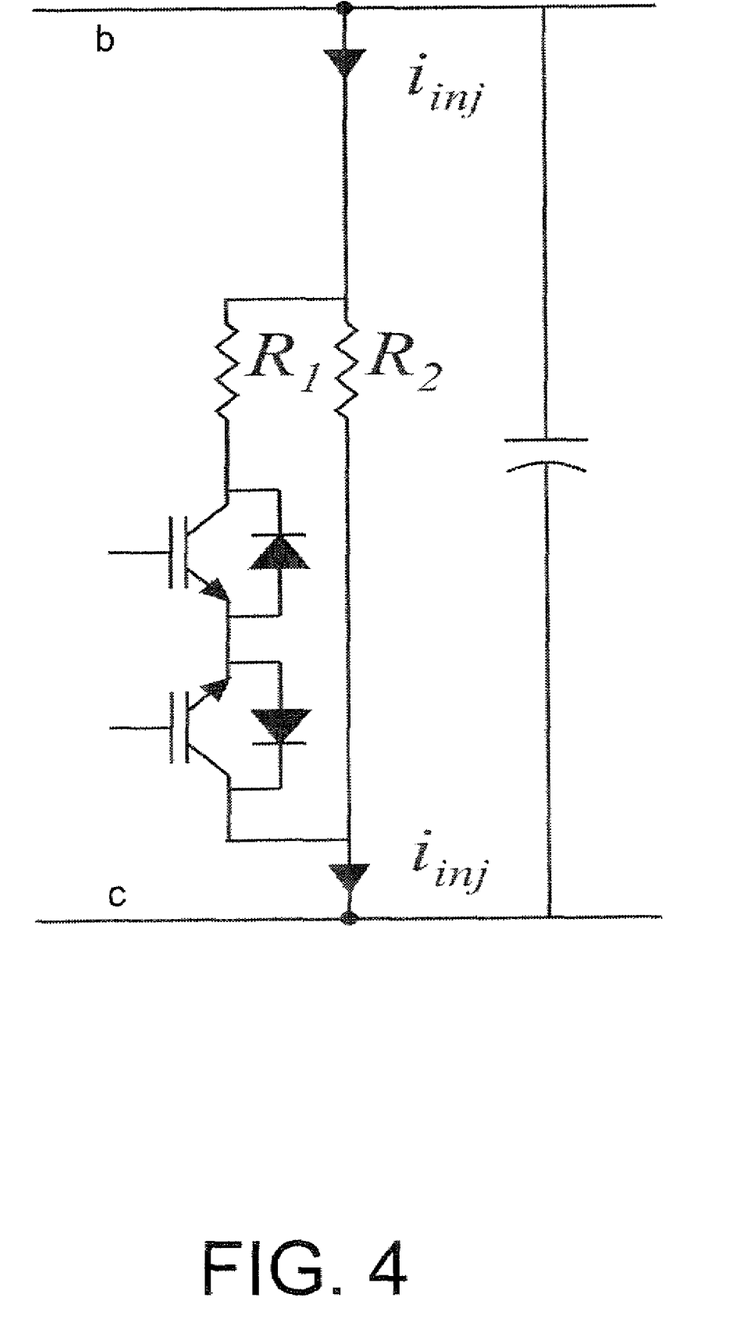
FIG. 4 is an illustration of a current injection device according to an embodiment of the invention.

According to some embodiments of the systems and methods described herein, the current injection device can be a chopper circuit or use a line to line chopper topology. FIG. 4 illustrates a chopper circuit functioning as a current injection device. This circuit may be an R load where a load resistance can be changed by switching the power transistors. The transistors may be switched using square-waves with fixed 50% duty cycle, and a clock frequency is set to $\omega_s \pm 2\omega_e$. The chopper circuit can be viewed in the d-q synchronous reference frame as a switched R load with varying square-wave impedance. Additionally, the chopper circuit includes a capacitor for avoiding large voltage spikes The switching waveform for the chopper transistor command is a square wave which can be expressed by the sum of a series of the harmonics of the switching frequency $$sw = d + 2\sum_{k=1}^{\infty} \frac{\sin(k\pi d)}{k\pi}\cos(k\omega t)$$

where d is the duty cycle, k is the harmonic number, $\omega$ is the switching frequency, which was $\omega_s \pm 2\omega_e$.

The coefficient of each harmonic is $$\frac{2\sin(k\pi d)}{k\pi}$$

with an offset of d; the value of which decreases as k increases. It can be seen the term at the switching frequency is dominant. When duty cycle d is set to 50%, this term can have maximum amplitude.

The equivalent resistance of the chopper circuit in the example is $$R = sw(R_1 \| R_2) + (1-sw)R_2 = R_2 - sw\frac{R_2^2}{R_1 + R_2}$$

The equivalent admittance is obtained by taking inverse of equivalent resistance. In one case $R_1$ and $R_2$ are equal, and in another case $R_2$ is infinite. The admittances of these two cases are $$Y_{case1} = \frac{1}{R} = \frac{2}{R_1(2-sw)} = \frac{1+sw}{R_1}$$

$$Y_{case2} = \frac{sw}{R_1}$$

Considering the dominant terms of the waveform, the injected current becomes:

$$i_{acinj\_case} = v_{bc}Y$$
$$= \frac{V_{ll}\cos(\omega_e t)}{R_1}\left(a + d + 2\frac{\sin(\pi d)}{\pi}\cos(\omega_s t \pm 2\omega_e t)\right)$$
$$= \frac{V_{ll}}{R_1}(a+d)\cos(\omega_e t) + \frac{V_{ll}\sin(\pi d)}{\pi R_1}\cos(\omega_s t \pm 3\omega_e t) \ldots +$$
$$\frac{V_{ll}\sin(\pi d)}{\pi R_1}\cos(\omega_s t \pm \omega_e t)$$

in case 1

$$i_{dcinj\_case} = v_{dc}Y = V_{dc}\frac{a + d + 2\frac{\sin(\pi d)}{\pi}\cos(\omega_s t)}{R_1}$$
$$= \frac{V_{dc}}{R_1}(a+d) + \frac{V_{dc}2\sin(\pi d)}{\pi R_1}\cos(\omega_s t)$$

in case 2 where a is equal to 1 in case 1 and a is equal to 0 in case 2.

However, the injected current is generally mathematically removed when the voltage and current are extracted in the d-q synchronous reference frame.

An advantage of the chopper circuit is that because a switching frequency is set to $\omega_s 35\ 2\omega_e$ and is very low the circuit is suitable for medium-voltage systems where transistor switching frequency is limited. An additional advantage is that hardware configuration of the chopper circuit is simple. A disadvantage is that the injected current will have considerable harmonics. However, these are physically reduced by the system inductance and mathematically removed by the FFT process.

Aspects of some embodiments of the systems and methods described herein are demonstrated in the following example:

EXAMPLE 1

Figure 5:
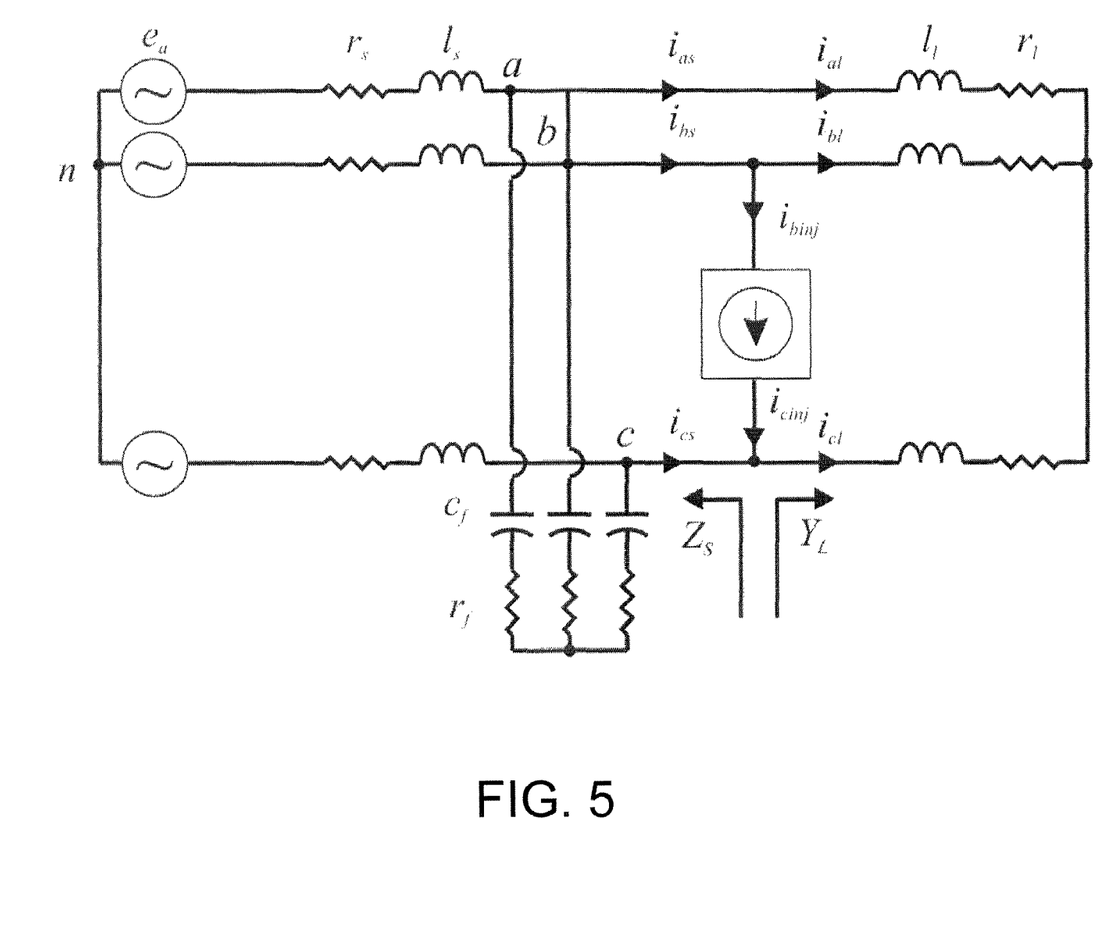
FIG. 5 is an illustration of an example three phase ac circuit injected by a current injection device according to an embodiment of the invention.
Figure 6A:
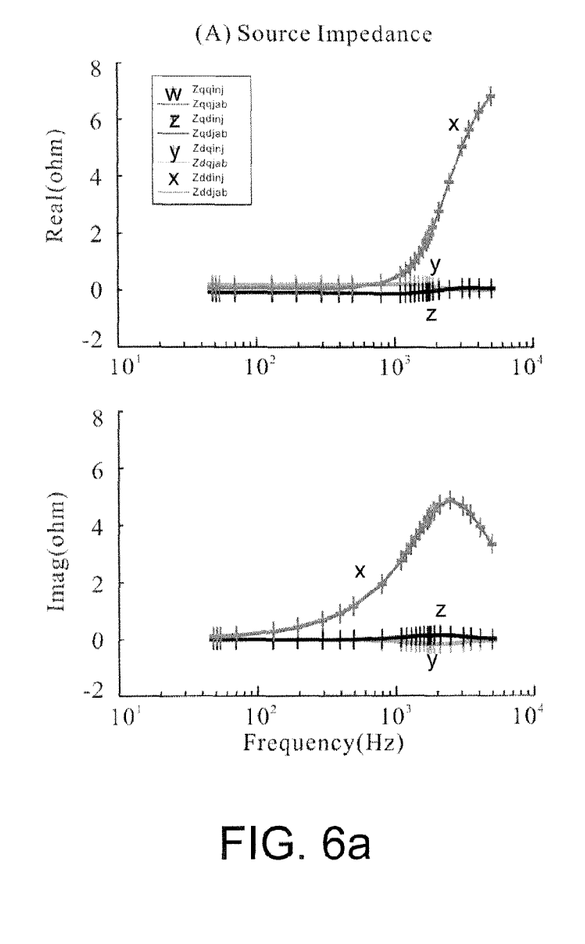
FIG. 6a graphically depicts source impedance data for certain three phase ac circuits of the invention.
Figure 6B:
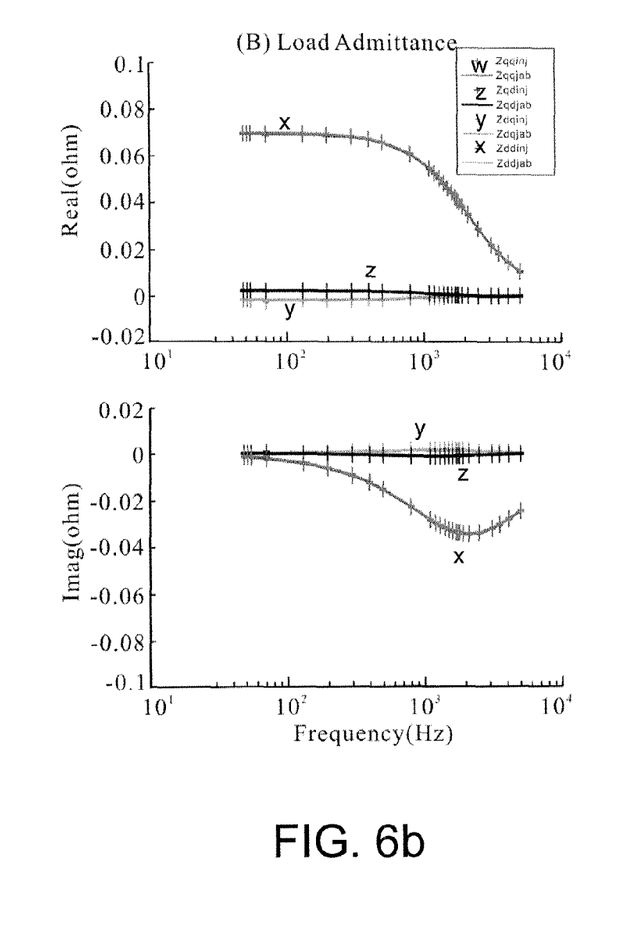
FIG. 6b graphically depicts load impedance data for certain three phase ac circuits of the invention.

FIG. 5 illustrates a three phase ac circuit injected by a current injection device. In the example, the injection device is a chopper circuit. Further, in the example a line-to-line chopper circuit injection was simulated for the three phase ac circuit shown in FIG. 5 using Advanced Continuous Simulation Language (ACSL). A fixed-frequency (60 Hz) ac power source with input inductors is used to represent a utility grid or a d-q synchronous generator. The source is connected to an R-L load through a R-C filter. The injection circuit was placed after the R-C filter and before the R-L load. Therefore, the source impedance measured in this system is composed of source R-L circuit and R-C filter. The load impedance is a simple R load circuit. The frequency was swept from 48-Hz to 4995 Hz and the source impedance and load admittance was extracted for each frequency. FIG. 6a graphically depicts source impedances determined from simulation using chopper circuit current injection. FIG. 6b graphically depicts a load admittances determined from simulation using chopper circuit current injection. A Jacobian analysis was also applied in ACSL to obtain the Thevenin q-d impedance matrix. This is a frequency domain calculation about the current point in state space by numerical perturbation. The Thevenin q-d impedance matrix was then used to compare with simulation results from the injected signal. In FIGS. 6a and 6b, the solid line denotes the Thevenin q-d impedance and the +markers correspond to the points predicted from the injection methods. The effectiveness of injection methods was validated in the simulation.

Figure 7A:
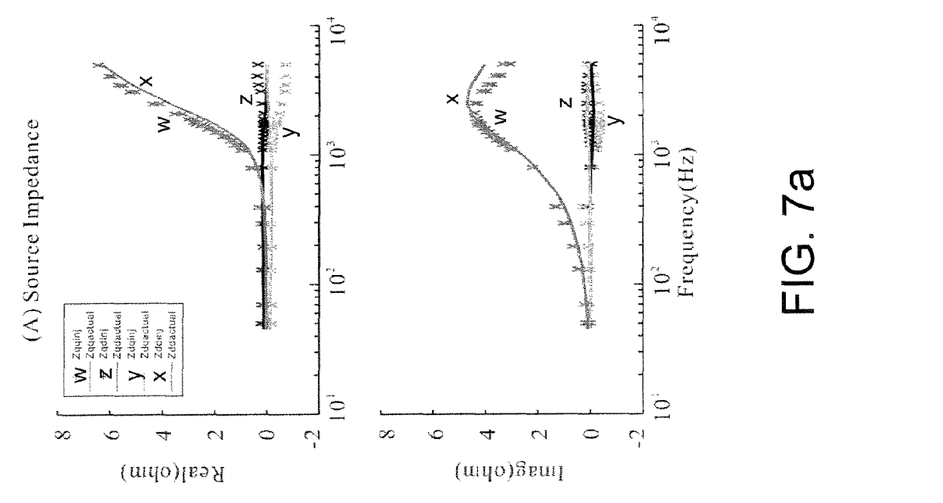
FIG. 7a graphically depicts source impedance data for certain three phase ac circuits of the invention.
Figure 7B:
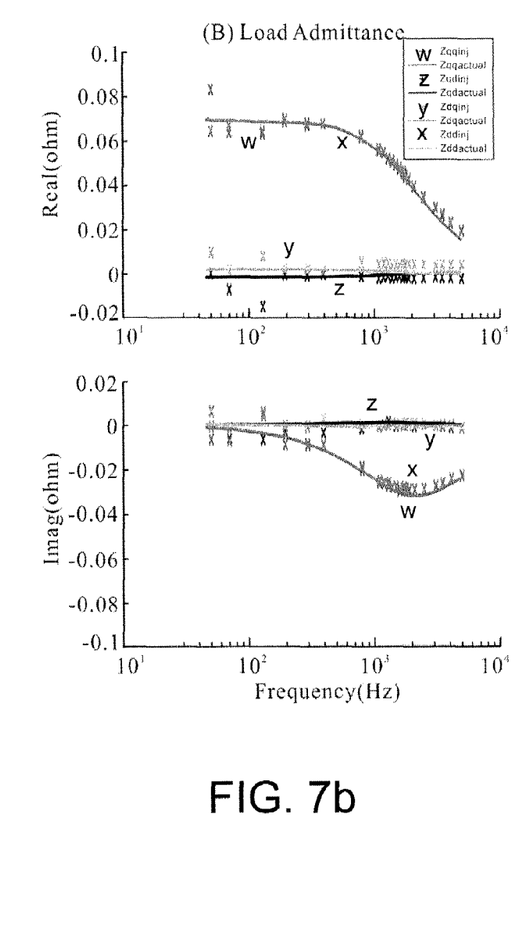
FIG. 7b graphically depicts load impedance data for certain three phase ac circuits of the invention.

In an example, the three phase ac circuit including the current injection device of FIG. 5 was constructed in a laboratory and the effectiveness of the injection methods were verified. A line-to-line chopper injection circuit was built in the laboratory. The circuit was the same as circuit simulated in Example 1. The chopper circuit was operating with $R_c=200\Omega$. The injection frequencies were swept from 50 Hz to 4,995 Hz. To avoid the effects of system harmonics on the injection signal measurement, all the frequencies that are multiples of system fundamental frequency were skipped during the test. The data acquisition device sampling frequency and resolution was high enough for injection frequencies to be extracted without degradation of accuracy. Each passive component used an Elgar-SW5250A (i.e. Elgar SmartWave Switching Amplifier) for consideration of parasitic elements at higher frequencies. The actual impedance was obtained mathematically for each measured component, and the resulting impedance is shown as the solid line. The x's are from the line-to-line injection measurements using the chopper circuit. The data is displayed in real and imaginary part. FIGS. 7a and 7b express the real part and imaginary part of the impedance respectively. From FIGS. 7a and 7b is can be seen that the measured impedances are very close to their actual values.

Figure 8:
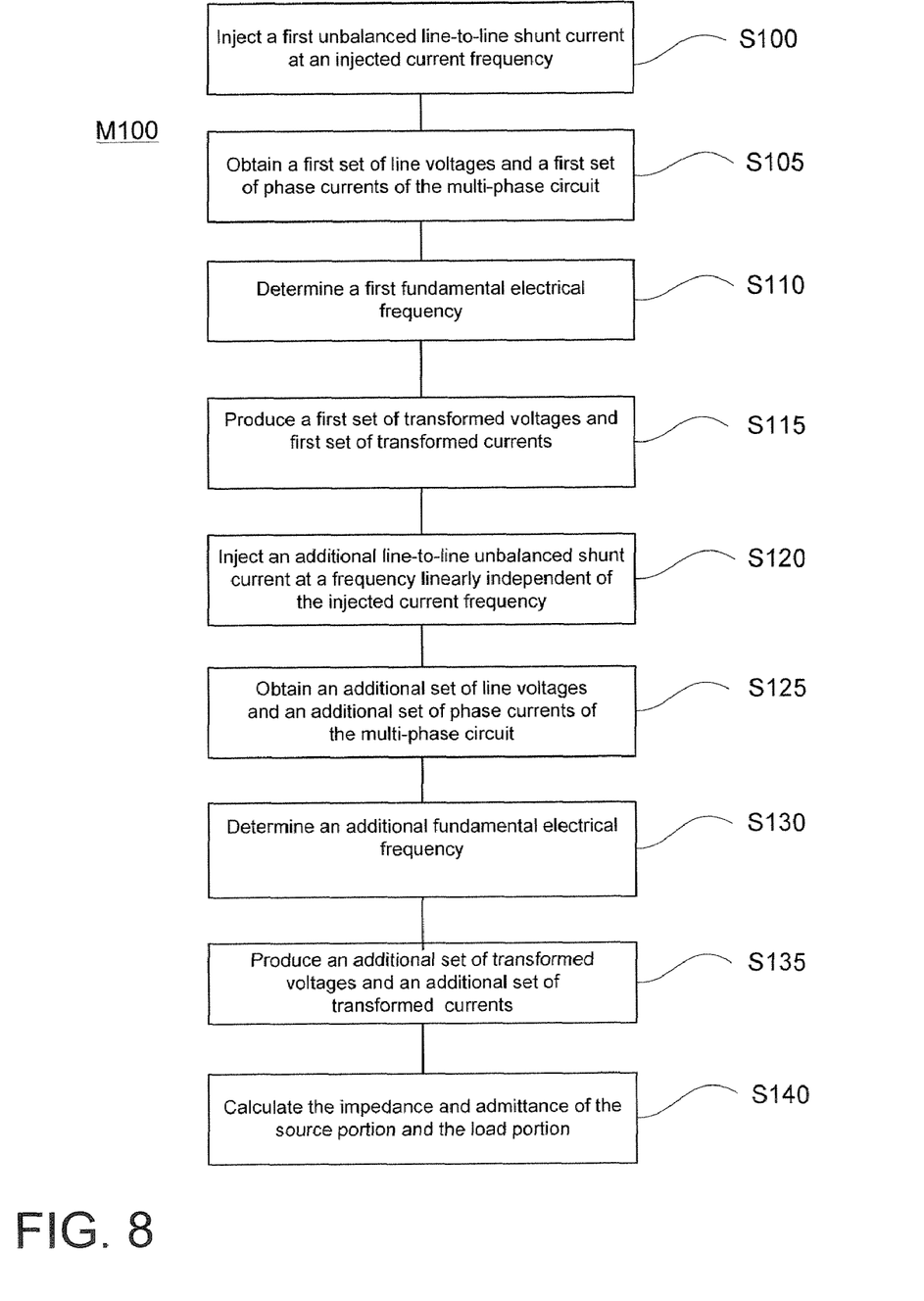
FIG. 8 is a method of measuring impedance according to an embodiment of the invention.

FIG. 8 is a flow chart of a method M100 of measuring impedance of a source portion and a load portion of a multi-phase ac circuit according to some embodiments of the systems and methods described herein. At S100, an unbalanced line-to-line shunt current is injected at an injected current frequency in the multi-phase ac circuit. For example, a current injection device may injected the line-to-line unbalanced shunt current in the multi-phase ac circuit. At S105, a first set of line voltages and a first set of phase currents of the multi-phase ac circuit are obtained. An interface device may obtain the first set of line voltages and the first set of phase currents via a circuit interface. At S110, a first fundamental electrical frequency for the first set of line voltages and the first set of phase currents is determined. For example, a extraction module of the interface device may obtain the first fundamental frequency. At S115, a first set of transformed voltages and a first set of transformed currents are produced by applying a fast Fourier transform to the first set of line voltages and the first set of phase currents at a frequency of interest and transforming the first set of line voltages and the first set of phase currents to a q-d synchronous reference frame using the first fundamental electrical frequency. For example, a transform module of the interface device may produce the first set of transformed voltages and the first set of transformed currents.

At S120, an additional unbalanced line-to-line shunt current is injected at a frequency linearly independent of the injected current frequency in the multi-phase ac circuit. The current injection device may inject the multi-phase ac circuit with an additional unbalanced line-to-line shunt current. At S125, an additional set of line voltages and an additional set of phase currents of the multi-phase ac circuit are obtained. The interface device may obtain the additional set of line voltages and the additional set of phase currents via a circuit interface. At S130, an additional fundamental electrical frequency for the additional set of line voltages and the additional set of phase currents is determined. For example, an extraction module of the interface device may obtain the additional fundamental frequency. At S135, an additional set of transformed voltages and an additional set of transformed currents are produced by applying a fast Fourier transform to the additional set of line voltages and the additional set of phase currents at a frequency of interest and transforming the additional set of line voltages and the additional set of phase currents to a q-d synchronous reference frame using the additional fundamental electrical frequency. For example, a transform module of the interface device may produce the additional set of transformed voltages and the additional set of transformed currents. At S140, the impedance and/or admittance of the source portion of the multi-phase ac circuit is calculated using the first set of transformed voltages, the first set of transformed currents, the additional set of transformed voltages, and the additional set of transformed currents. An impedance calculation module of the interface device may calculate the impedance and/or admittance of the source portion of the multi-phase ac circuit. The impedance and/or admittance of the load portion of the multi-phase ac circuit is calculated using the first set of transformed voltages, the first set of transformed currents, the additional set of transformed voltages, and the additional set of transformed currents. An impedance calculation module of the interface device may calculate the impedance and/or admittance of the load portion of the multi-phase ac circuit.

Figure 9:
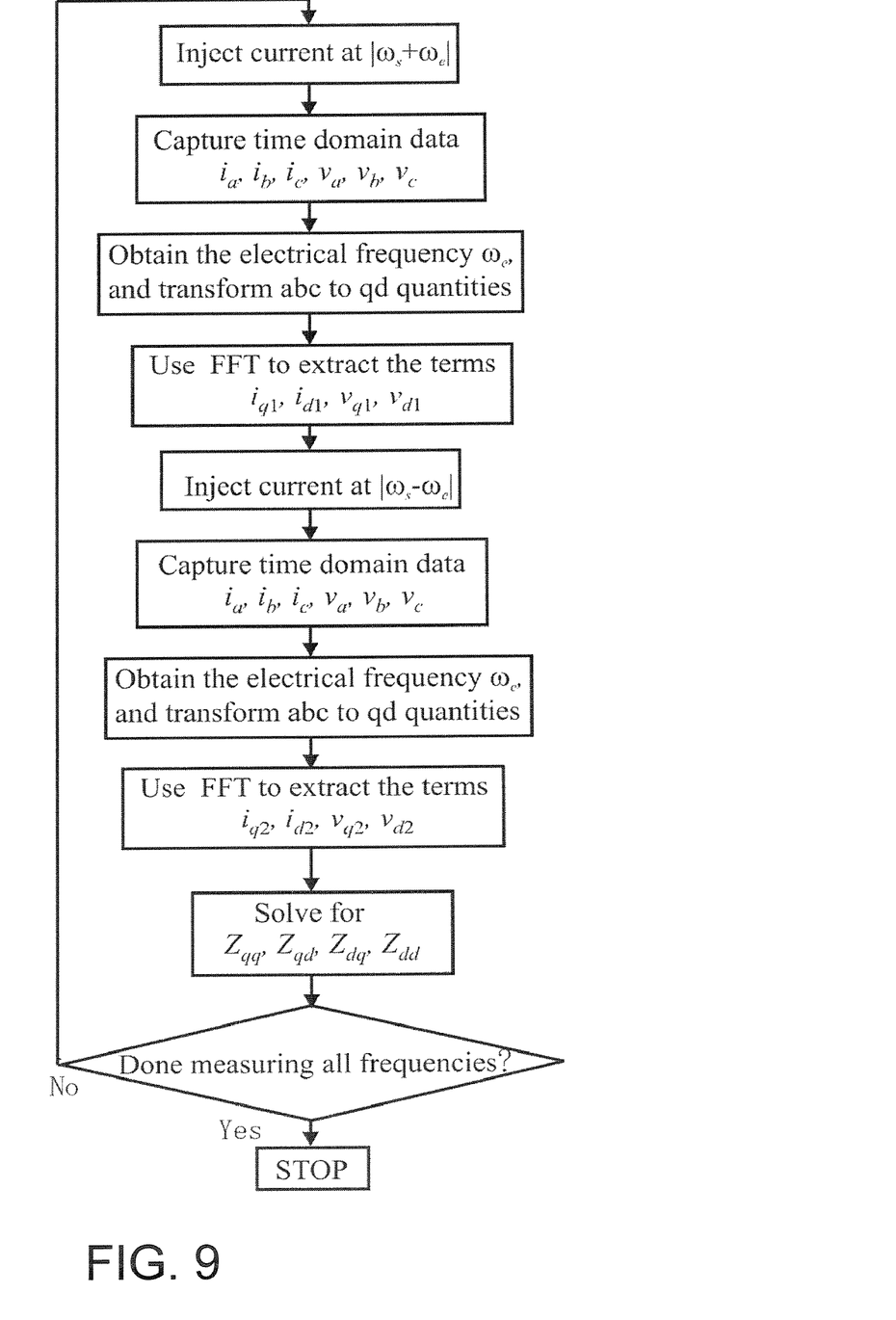
FIG. 9 is a method of measuring impedance according to an embodiment of the invention.

FIG. 9 illustrates a detailed embodiment of FIG. 8.

While the foregoing illustrates and describes exemplary embodiments of this invention, it is to be understood that the invention is not limited to the construction disclosed herein. The invention can be embodied in other specific forms without departing from its spirit or essential attributes.

What is claimed is:

1. A method for measuring impedance in a three phase alternating current (ac) circuit, the three phase ac circuit having a source portion and a load portion that are integrally connected at each phase of the three phase ac circuit, the method comprising:
   injecting a first unbalanced line-to-line shunt current at an injected current frequency in the three phase ac circuit;
   obtaining a first set of line voltages and a first set of phase currents of the three phase ac circuit;
   determining a first fundamental electrical frequency for the first set of line voltages and the first set of phase currents;
   determining a first set of transformed voltages and a first set of transformed currents by
     applying a fast Fourier transform to the first set of line voltages and the first set of phase currents at a frequency of interest and
     transforming the first set of line voltages and the first set of phase currents to a q-d synchronous reference frame using the first fundamental electrical frequency;

injecting a second unbalanced line-to-line shunt current at a frequency linearly independent of the injected current frequency in the three phase ac circuit;

obtaining a second set of line voltages and a second set of phase currents of the three phase ac circuit;

determining a second fundamental electrical frequency for the second set of line voltages and the second set of phase currents;

determining a second set of transformed voltages and a second set of transformed currents by applying a fast Fourier transform to the second set of line voltages and the second set of phase currents at a frequency of interest and transforming the second set of line voltages and the second set of phase currents to a q-d synchronous reference frame using the second fundamental electrical frequency; and calculating an impedance for one of the set consisting of the source portion of the three phase ac circuit and the load portion of the three phase ac circuit using the first set of transformed voltages, the first set of transformed currents, the second set of transformed voltages, and the second set of transformed currents.

2. A method according to claim 1, further comprising calculating an impedance of the other of the set consisting of the source portion of the three phase ac circuit and the load portion of the three phase ac circuit using the first set of transformed voltages, the first set of transformed currents, the second set of transformed voltages, and the second set of transformed currents.

3. A method according to claim 1, further comprising calculating an admittance for one of the set consisting of the source portion of the three phase ac circuit and the load portion of the three phase ac circuit using the first set of transformed voltages, the first set of transformed currents, the second set of transformed voltages, and the second set of transformed currents.

4. A method according to claim 3, further comprising calculating an admittance of the other of the set consisting of the source portion of the three phase ac circuit and the load portion of the three phase ac circuit using the first set of transformed voltages, the first set of transformed currents, the second set of transformed voltages, and the second set of transformed currents.

5. A method according to claim 1, wherein the impedance is calculated over a predetermined frequency range.

6. A method according to claim 1, wherein a phase of the three phase ac circuit that is not being injected by the unbalanced line to line shunt current has a current equal to zero.

7. A method according to claim 1, wherein the unbalanced line-to-line shunt current is injected using a current injection device comprising at least one of the set consisting of an H-bridge circuit, a chopper circuit and an ideal amplifier.

8. A method according to claim 1, wherein the action of determining a first fundamental electrical frequency includes filtering a line voltage from the first set of line voltages and counting a fundamental period of the filter signal; and the action of determining a second fundamental electrical frequency includes filtering a line voltages from the second set of line voltages and counting a fundamental period of the filter signal.

9. A method for measuring impedance in a multi-phase alternating current (ac) circuit, the multi-phases ac circuit having a source portion and a load portion that are integrally connected at each phase of the multi-phase ac circuit, the method comprising:

injecting a first unbalanced line-to-line shunt current at an injected current frequency in the multi-phase ac circuit;

obtaining a first set of line voltages and a first set of phase currents of the multi-phase ac circuit;

determining a first fundamental electrical frequency for the first set of line voltages and the first set of phase currents;

determining a first set of transformed voltages and a first set of transformed currents by applying a fast Fourier transform to the first set of line voltages and the first set of phase currents at a frequency of interest and transforming the first set of line voltages and the first set of phase currents to a q-d synchronous reference frame using the first fundamental electrical frequency;

injecting at least a second unbalanced line-to-line shunt current at a frequency linearly independent of the injected current frequency in the multi-phase ac circuit;

obtaining at least a second set of line voltages and at least a second set of phase currents of the multi-phase ac circuit;

determining at least a second fundamental electrical frequency for the at least a second set of line voltages and the at least a second set of phase currents;

determining at least a second set of transformed voltages and at least a second set of transformed currents by applying a fast Fourier transform to the at least a second set of line voltages and the at least a second set of phase currents at a frequency of interest and transforming the at least a second set of line voltages and the at least a second set of phase currents to a q-d synchronous reference frame using the at least a second fundamental electrical frequency; and calculating an impedance for one of the set consisting of the source portion of the multi-phase ac circuit and the load portion of the multi-phase ac circuit using the first set of transformed voltages, the first set of transformed currents, the at least a second set of transformed voltages, and the at least a second set of transformed currents.

10. A method according to claim 9, further comprising calculating an impedance of the other of the set consisting of the source portion of the multi-phase ac circuit and the load portion of the multi-phase ac circuit using the first set of transformed voltages, the first set of transformed currents, the at least a second set of transformed voltages, and the at least a second set of transformed currents.

11. A method according to claim 9, further comprising calculating an admittance for one of the set consisting of the source portion of the multi-phase ac circuit and the load portion of the multi-phase ac circuit using the first set of transformed voltages, the first set of transformed currents, the at least a second set of transformed voltages, and the at least a second set of transformed currents.

12. A method according to claim 11, further comprising calculating an admittance of the other of the set consisting of the source portion of the multi-phase ac circuit and the load portion of the multi-phase ac circuit using the first set of transformed voltages, the first set of transformed currents, the at least a second set of transformed voltages, and the at least a second set of transformed currents.

13. A method according to claim 9, wherein the impedance is calculated over a predetermined frequency range.

14. A method according to claim 9, wherein a phase of the multi-phase ac circuit that is not being injected by the unbalanced line to line shunt current has a current equal to zero.

15. A method according to claim 9, wherein the unbalanced line-to-line shunt current is injected using a current injection device comprising at least one of the set consisting of an H-bridge circuit, a chopper circuit and an ideal amplifier.

16. A system for measuring impedance of a multi-phase ac circuit, the multi-phases ac circuit having a source portion and a load portion that are integrally connected at each phase of the multi-phase ac circuit, the system comprising:

a current injection device configured for injecting in the multi-phase ac circuit a first unbalanced line-to-line shunt current at an injected current frequency and for injecting in the multi-phase ac circuit at least a second unbalanced line-to-line shunt current at a frequency linearly independent of the injected current frequency; and an interface device configured for determining an impedance of a portion of the multi-phase ac circuit, the interface device including a circuit interface adapted for measuring a first set of line voltages and a first set of phase currents of the multi-phase ac circuit when the first unbalanced line-to-line shunt current is injected and for measuring at least a second set of line voltages and at least a second set of phase currents of the multi-phase ac circuit when the at least a second unbalanced line-to-line shunt current is injected, an extraction module adapted for determining a first fundamental electrical frequency for the first set of line voltages and the first set of phase currents, and determining at least a second fundamental electrical frequency for the at least a second set of line voltages and the at least a second set of phase currents, a transform module adapted for applying a fast Fourier transform to the first set of line voltages and the first set of phase currents at a frequency of interest and transforming the first set of line voltages and the first set of phase currents to a q-d synchronous reference frame using the first fundamental electrical frequency to produce the first set of transformed voltages and the first set of transformed currents, and applying a fast Fourier transform to the at least a second set of line voltages and the at least a second set of phase currents at a frequency of interest and transforming the at least a second set of line voltages and the at least a second set of phase currents to a q-d synchronous reference frame using the at least a second fundamental electrical frequency to produce the at least a second set of transformed voltages and the at least a second set of transformed currents; and an impedance calculation module adapted for calculating an impedance for at least one of the set consisting of the source portion of the multi-phase ac circuit and the load portion of the multi-phase ac circuit using the first set of transformed voltages, the first set of transformed currents, the at least a second set of transformed voltages, and the at least a second set of transformed currents.

17. A system according to claim 16, wherein the impedance calculation module is further adapted for calculating an impedance of the other of the set consisting of the source portion of the multi-phase ac circuit and the load portion of the multi-phase ac circuit using the first set of transformed voltages, the first set of transformed currents, the at least a second set of transformed voltages, and the at least a second set of transformed currents.

18. A system according to claim 16, wherein the impedance calculation module is further adapted for calculating an admittance for one of the set consisting of the source portion of the multi-phase ac circuit and the load portion of the multi-phase ac circuit using the first set of transformed voltages, the first set of transformed currents, the at least a second set of transformed voltages, and the at least a second set of transformed currents.

19. A system according to claim 18, wherein the impedance calculation module is further adapted for calculating an admittance of the other of the set consisting of the source portion of the multi-phase ac circuit and the load portion of the multi-phase ac circuit using the first set of transformed voltages, the first set of transformed currents, the at least a second set of transformed voltages, and the at least a second set of transformed currents.

20. A system according to claim 16, wherein the impedance is calculated over a predetermined frequency range.

21. A system according to claim 16, wherein the current injection device comprises at least one of the set consisting of an H-bridge circuit, a chopper circuit and an ideal amplifier.

22. A system according to claim 21, wherein the current injection device includes components of at least one of the set consisting of an insulated-gate bipolar transistor semiconductor switch, an Integrated Gate Commutated Thyristor switch, an field-effect transistor switch or any other type of switch.

* * * * *